(12) United States Patent
Shutter

(10) Patent No.: US 6,224,425 B1
(45) Date of Patent: May 1, 2001

(54) SIMPLIFIED MICROELECTRONIC CONNECTOR AND METHOD OF MANUFACTURING

(75) Inventor: Ronald A. Shutter, Encinitas, CA (US)

(73) Assignee: Pulse Engineering, Inc., San Diego, CA (US)

(*) Notice: Subject to any disclaimer, the term of this patent is extended or adjusted under 35 U.S.C. 154(b) by 0 days.

(21) Appl. No.: 09/295,285

(22) Filed: Apr. 20, 1999

Related U.S. Application Data

(60) Provisional application No. 60/082,466, filed on Apr. 20, 1998.

(51) Int. Cl.[7] .................................................. H01R 13/66
(52) U.S. Cl. ............................................ 439/620; 439/676
(58) Field of Search ................................. 439/620, 676, 439/188, 78, 79

(56) References Cited

U.S. PATENT DOCUMENTS

| | | |
|---|---|---|
| 4,695,115 | 9/1987 | Talend . |
| 4,726,638 | 2/1988 | Farrar et al. . |
| 4,772,224 | 9/1988 | Talend . |
| 4,995,834 | 2/1991 | Hasegawa . |
| 5,015,204 | 5/1991 | Sakamoto et al. . |
| 5,015,981 | 5/1991 | Lint et al. . |
| 5,069,641 | 12/1991 | Sakamoto et al. . |
| 5,139,442 | 8/1992 | Sakamoto et al. . |
| 5,178,563 | 1/1993 | Reed . |
| 5,282,759 | 2/1994 | Sakamoto et al. . |
| 5,397,250 | 3/1995 | Briones . |
| 5,399,107 | 3/1995 | Gentry et al. . |
| 5,403,207 | 4/1995 | Briones . |
| 5,456,619 | 10/1995 | Belopolsky et al. . |
| 5,475,921 | 12/1995 | Johnston . |
| 5,587,884 | 12/1996 | Raman . |
| 5,647,767 | 7/1997 | Scheer et al. . |
| 5,687,233 | 11/1997 | Loudermilk et al. . |
| 5,736,910 | 4/1998 | Townsend et al. . |
| 5,766,043 | 6/1998 | Talend . |
| 5,872,492 | 2/1999 | Boutros . |
| 5,876,239 | 3/1999 | Morin et al. . |

FOREIGN PATENT DOCUMENTS

| | | |
|---|---|---|
| 654865 A1 | 5/1995 | (EP) . |
| WO94/05059 | 3/1994 | (WO) . |

OTHER PUBLICATIONS

International Search Report re PCT/US99/08650; Date of mailing of International Search Report: Aug. 3, 1999.

U.S. Patent Application No. 08/863,654, Filed May 27, 1997.

*Primary Examiner*—Paula Bradley
*Assistant Examiner*—Tho D. Ta
(74) *Attorney, Agent, or Firm*—Knobbe Martens Olson & Bear LLP

(57) ABSTRACT

A modular microelectronic connector having an electrical component or component package molded directly within the connector body and preformed electrical leads which facilitate rapid and simplified connector assembly. In a first embodiment, the component package is molded directly within a one-piece connector body having a series of grooves on the exterior of the body, and the elongated leads of the package are deformed so as to extend into place within the grooves and ultimately within a modular plug receptacle so as to mate with the contacts of the plug. In a second embodiment, a component package having substantially elongated leads is molded within a rear body element or trailer which is then mated with a front body element (sleeve) having a modular plug receptacle. The leads are inserted through a series of apertures in the sleeve and deformed so as to extend into the cavity of the receptacle to form the electrical contacts for the plug. A method of manufacturing the above-described connectors is also disclosed.

13 Claims, 17 Drawing Sheets

SIMPLIFIED MICROELECTRONIC CONNECTOR AND METHOD OF MANUFACTURING

RELATED APPLICATIONS

This patent application claims priority under 35 U.S.C. Section 119(e) to U.S. provisional patent application entitled, "Microelectronic Connector and Method of Manufacturing", Ser. No. 60/082,466, and filed on Apr. 20, 1998.

BACKGROUND OF THE INVENTION

1. Field of the Invention

The invention relates generally to miniature electrical connectors used in printed circuit board and other microelectronic applications, and particularly to an improved microelectronic connector and method of fabricating the same.

2. Description of Related Technology

Existing microelectronic electrical connectors (such as those of the RJ 45 or RJ 11 type) frequently incorporate magnetics or other electrical components within the connector body itself. These components may provide a variety of signal conditioning functions, such as noise suppression or signal transformation. Often, the magnetics or electrical components are fabricated as part of a package or separate device and then subsequently mounted on a small circuit board; the circuit board assembly is then mounted within a rear connector body element or "trailer." See FIG. 1. The trailer 12 is received by the front connector body or sleeve 14, the latter also receiving the modular plug (not shown). As shown in FIG. 1, a separate lead "carrier" 15 is also commonly used to maintain electrical separation between the leads 11 which mate with the modular plug. The lead carrier 15 is typically molded onto the leads at a location between the trailer and the distal end of the leads. See, for example, U.S. Pat. No. 5,587,884 assigned to the Whitaker Corporation, which describes a connector design incorporating both a trailer with circuit board and lead carrier.

However, the fabrication of such prior art connector designs typically requires a significant number of processing steps and labor, thereby increasing the cost. For example, fabrication of the lead carrier 15 shown in FIG. 1 is a separate process step which requires positioning of the leads and subsequent molding of the carrier. Also the front portion of the connector body or sleeve 14 in such a connector is required to be designed to receive the leads 11 and carrier 15 molded thereon. Furthermore, the rear portion of the sleeve 14 often must be adapted to frictionally receive the trailer 12 (or alternatively, have the trailer "snap" into the sleeve) so as to maintain the sleeve, trailer, and leads in relative alignment. These design requirements for the sleeve ultimately translate to increased unit costs, since the molds are more complex and additional process steps are required.

Additionally, the use of a circuit board within the connector body or trailer may adversely impact the cost and/or reliability of the connector. The circuit board must be separately fabricated, one or more electrical components mounted on the board, electrical connections soldered, and the board ultimately mounted within the trailer of the connector. Furthermore, electrical leads to and from the board must be provided, adding further complexity.

One alternative to using a circuit board assembly is the use of a prefabricated microelectronic component package such as that described in U.S. patent application Ser. No. 07/570,894, filed Aug. 21, 1990 and assigned to Pulse Engineering, Inc., now U.S. Pat. No. 5,015,981. Such packages are routinely used to provide noise suppression or other signal conditioning functions in electronic devices. These devices are typically manufactured in a dual in-line package (DIP) configuration of the type well known in the electronic arts. Some of the benefits of such devices include their comparatively low manufacturing cost, relative simplicity, and high degree of reliability.

Based on the foregoing, it would be most desirable to provide an improved microelectronic connector design which would allow for a simpler and more cost effective method of connector fabrication. Such an improved design would avoid the use of a circuit board within the connector body, and could also make use of stand-alone electrical components or existing low cost, high reliability component package technology to further reduce the overall cost of manufacturing the connector and increase the reliability and durability of the final product.

SUMMARY OF THE INVENTION

The invention satisfies the aforementioned needs by providing an improved microelectronic connector and method of fabricating the same.

In a first aspect of the invention, an improved microelectronic connector is disclosed which utilizes a preformed electrical component (such as a choke coil) or component package molded directly within a connector body. The component or package leads are specially sized and shaped to facilitate easy connector assembly and mating with an external device such as a printed circuit board.

In a first embodiment of the invention, a simplified one-piece microelectronic connector is disclosed utilizing a unitary connector body which is molded around a component package. The package is a DIP-type device having leads which initially extend from the package and connector body. The connector body (including a series of parallel grooves) is molded around the package; the package leads are subsequently bent into position within the grooves to form electrical contacts within the connector which mate with those of a modular plug received within the front portion of the connector body. No lead carrier or internal circuit board for mounting the electrical component is used in this embodiment, thereby greatly simplifying its manufacture.

In a second embodiment of the invention, a two-piece microelectronic connector is disclosed which utilizes separate front ("sleeve") and rear ("trailer") portions to form the connector body. The trailer houses the electrical component (or package), and is mated with the sleeve. One set of electrical leads of the package is routed through apertures in the sleeve and subsequently bent into position within a modular plug receptacle of the sleeve to form electrical contacts which mate with those of the modular plug. The trailer and sleeve portions of the connector body are maintained in relative alignment by the bent package leads and optionally with adhesive or mechanical locking devices on the trailer and/or sleeve. As with the prior embodiment, the lead carrier and internal circuit board are obviated.

In a third aspect of the invention, improved methods for fabricating the microelectronic connectors described above are disclosed.

DETAILED DESCRIPTION OF THE INVENTION

Reference is now made to the drawings wherein like numerals refer to like parts throughout.

Figure 1:
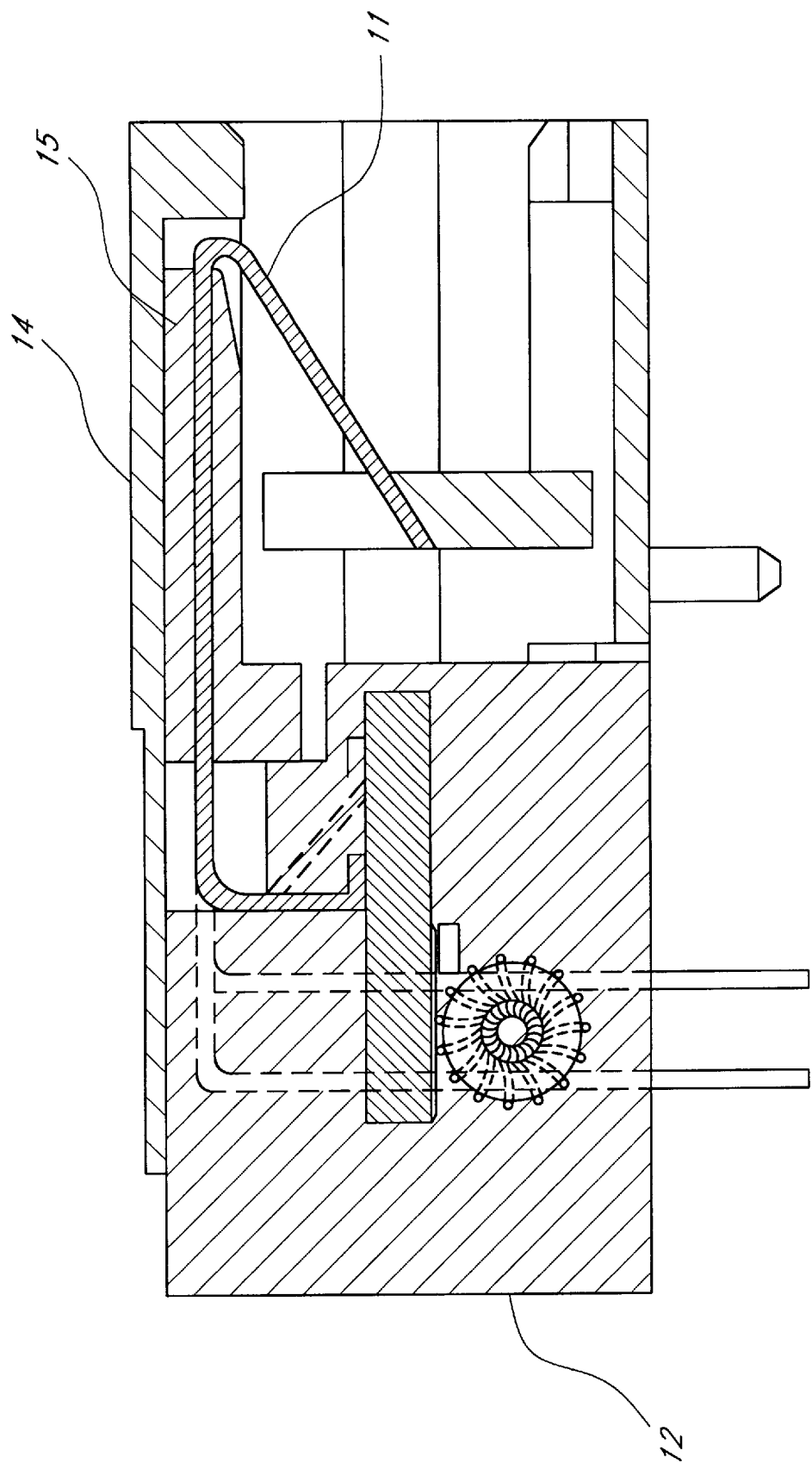
FIG. 1 is side cross-sectional view of a prior art electrical component connector utilizing a trailer, circuit board, and lead carrier.
Figure 2:
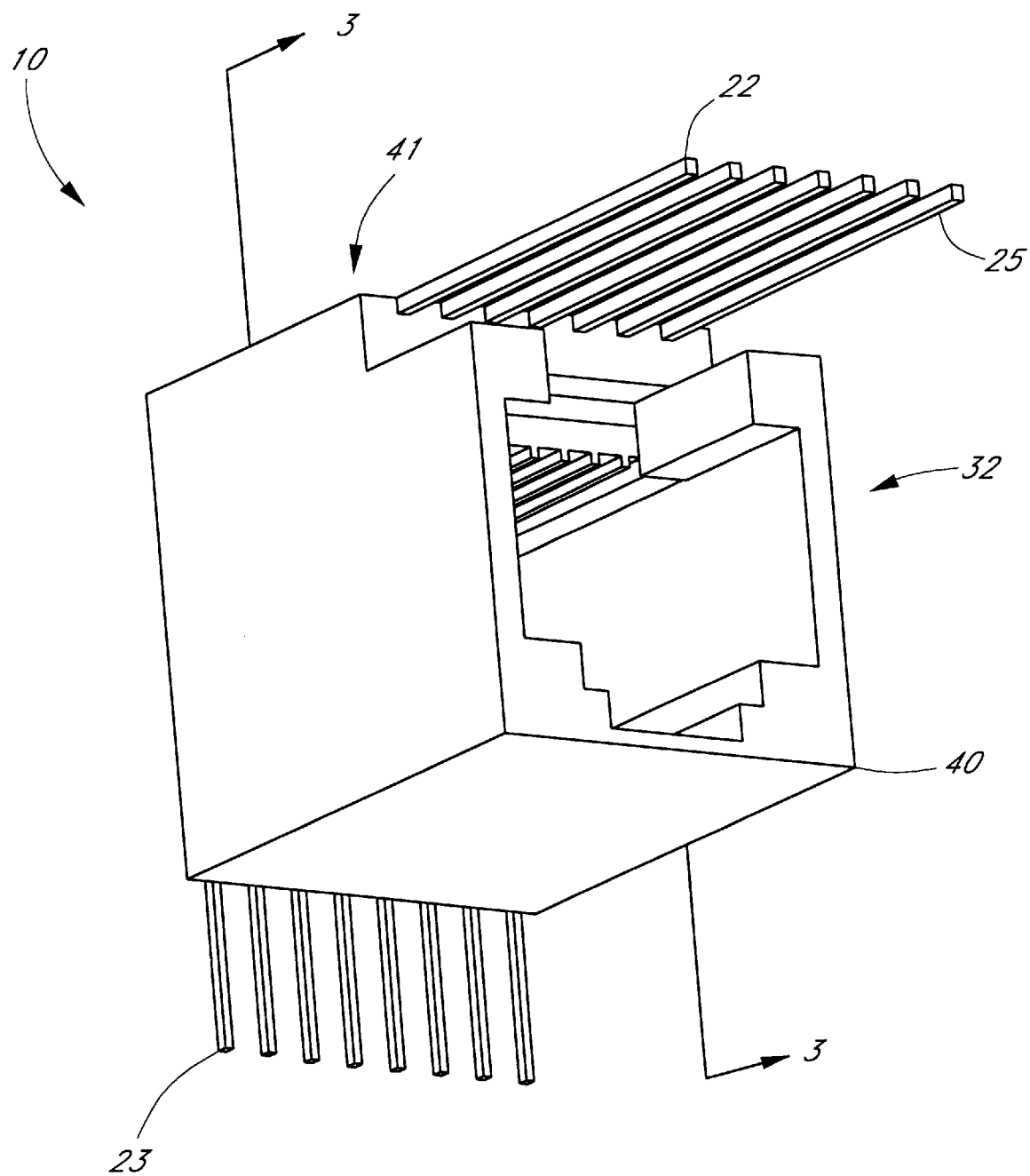
FIG. 2 is a perspective view of a first embodiment of the connector of the invention showing the connector prior to final lead deformation.

Referring to FIG. 2, a first embodiment of the microelectronic connector 10 of the present invention is shown. In this embodiment, a unitary connector housing 40 having a modular plug receptacle cavity 32 located in the front portion of the housing is employed. The unitary housing is formed from polymer, resin, or other suitable nonconductive material with the desired physical and electrical properties. Ideally, an injection molding process is used to form the housing 40, although it will be recognized that other processes (such as transfer molding) may conceivably be used. In the present embodiment the housing 40 is generally box-like in shape, though other shapes and cavity locations may be used as well.

As shown in FIG. 2, a first set 22 and second set 23 of individual yet substantially parallel electrical leads protrude from the top and bottom surfaces of the housing 40, respectively. These leads 22, 23, are electrically connected to an electrical component or package (described further below) embedded within the housing 40. The leads 22, 23, are ideally constructed of an electrically conductive material such as copper or aluminum, although other materials may be used. It will also be recognized that the conductivity or resistance of the leads may be varied (either intrinsically or through the use of discrete components) if desired to achieve the desired electrical properties of the connector. During manufacturing, the leads are typically fashioned from a single metallic or conductive framework, commonly known as a leadframe, and then subsequently trimmed to the required size as needed. In the present application, the spacing between the leads, commonly known as "pitch," is about 50 mils which corresponds to the typical spacing between the lead channels in the component package, although other spacings may be used.

Figure 2A:
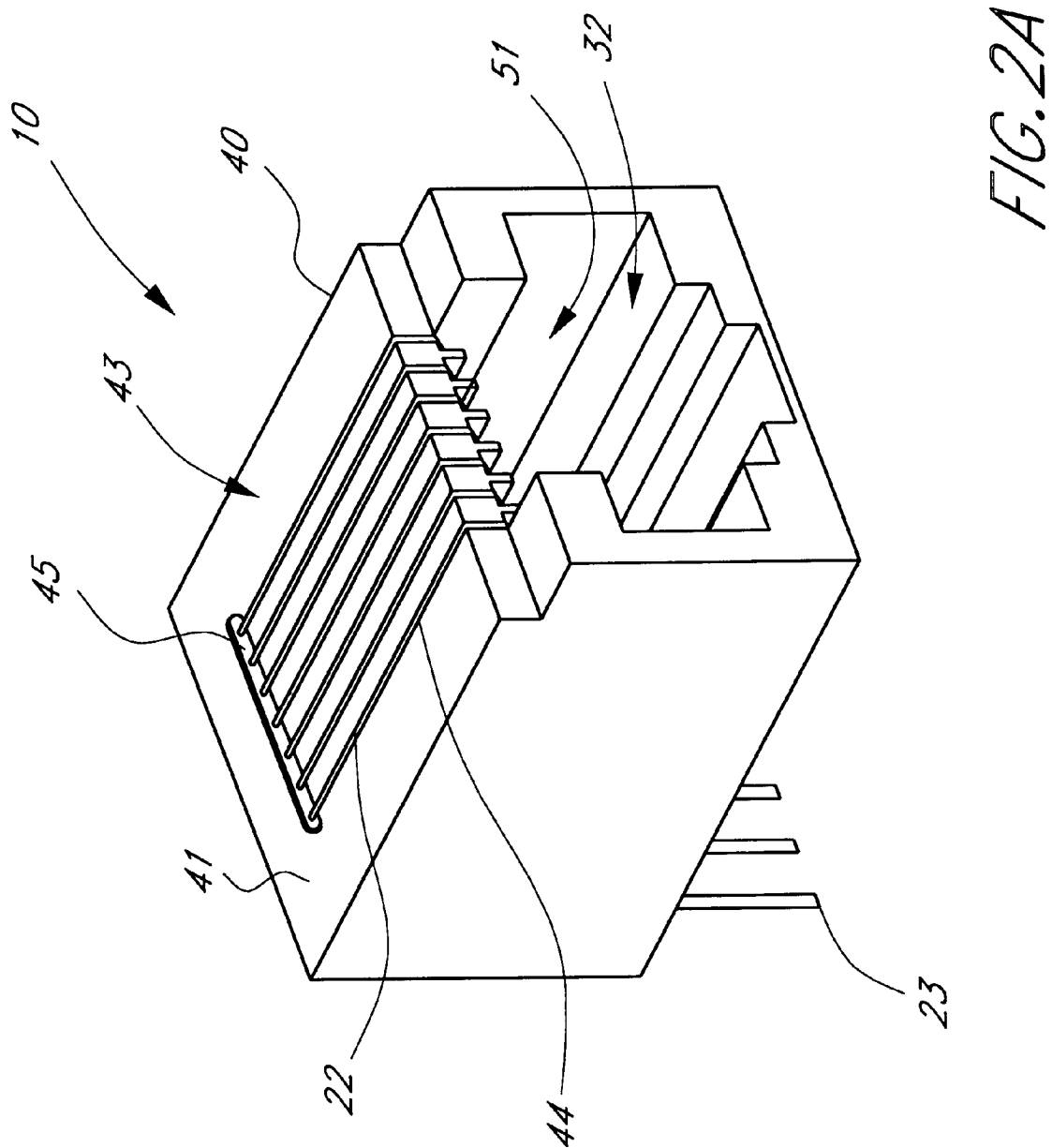
FIG. 2a is a perspective view illustrating the top surface of the embodiment of FIG. 2, showing the relationship between the first electrical leads, the grooves, and the channel.

The first set of leads 22 is used to provide an electrical pathway between the electrical contacts of the modular plug (not shown) which is received by the receptacle cavity 32. The second set of leads 23 provides an electrical pathway from the component/package to an external device such as a printed circuit board. As shown in FIG. 2a, longitudinal grooves 44 formed within the top surface 41 of the housing 40 receive the first set of package leads 22 when the leads are folded down from their initial position (typically normal to the top surface) during manufacture. These grooves 44 provide mechanical support and stability to the leads 22, as well as electrical separation. A transverse common groove 45 is also included in the present embodiment; this common groove allows the leads 22 to bend and enter the longitudinal grooves 44 while remaining below the top surface 41 of the connector, thereby minimizing its outer profile.

The grooves 44 of the present embodiment also include a taper portion 43 in which the spacing between the grooves 44 and leads 22 disposed therein is reduced from the 50 mil spacing previously described to 40 mils, the standard spacing associated with the contacts of an RJ type modular plug. It will be recognized that this taper portion 43 and reduced lead spacing is optional, and reduced spacing between the leads may be accomplished using alternative methods including the use of a smaller spacing on the leadframe of the component package.

Figure 3:
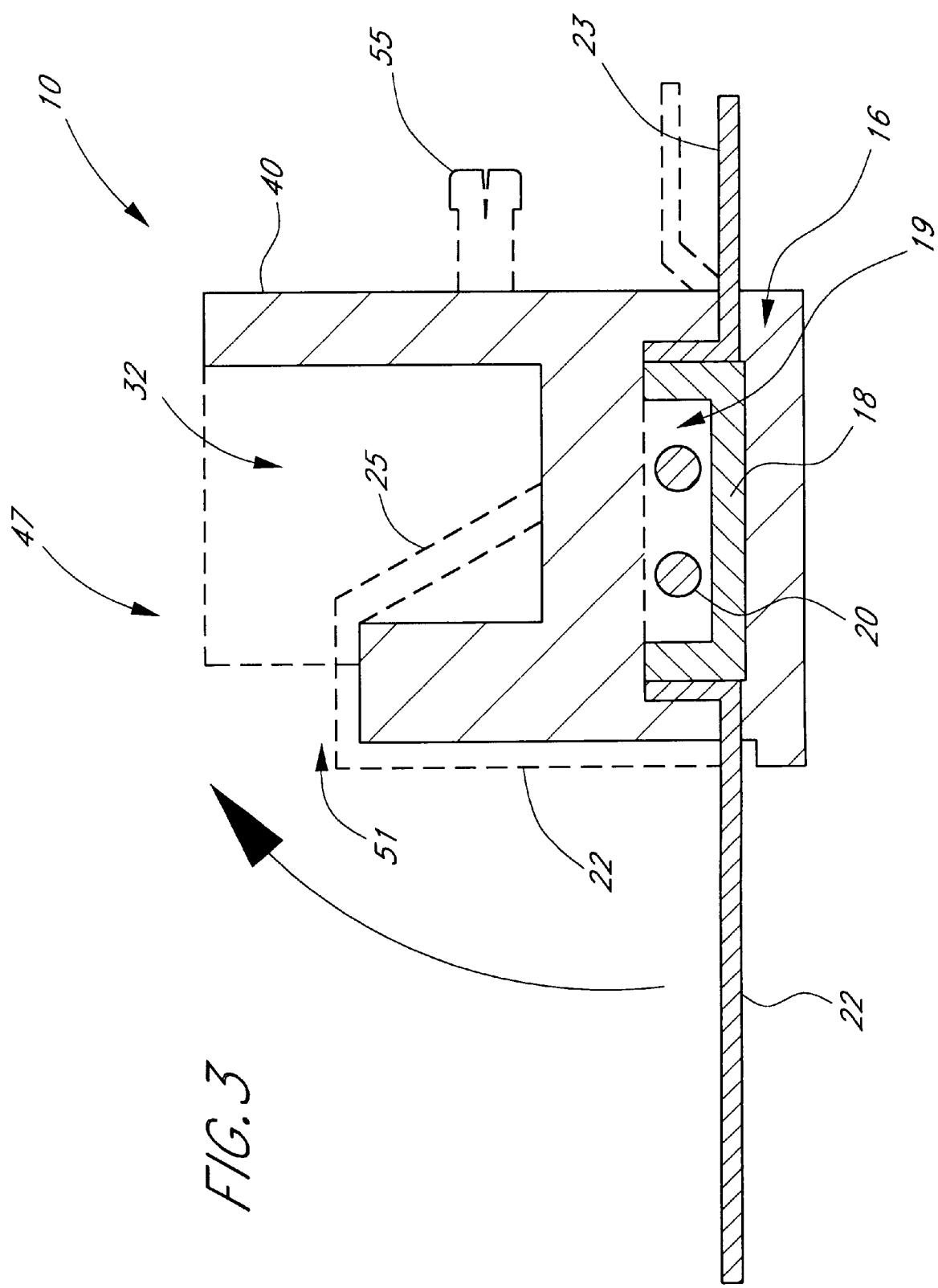
FIG. 3 is a cross-sectional view of the connector of FIG. 2 taken along line 3—3.

The longitudinal grooves 44 terminate at the front portion 47 of the connector housing 40 where they communicate with a channel 51 formed in the upper front portion of the housing. The channel 51 communicates with the modular plug cavity 32 such that the leads 22 may be folded down through the channel 51 into the cavity at an oblique angle as shown in FIG. 3. This angle is chosen to be approximately 30 degrees from horizontal (or 60 degrees from vertical) in the present embodiment, although other angles may be used. The oblique angle of the bend provides the distal ends 25 of the leads with a resilient property which exerts a substantially normal force on the contacts of the modular plug when the plug is inserted into the cavity 32. Note also that internal lead separators 27 are formed within the cavity 32 to provide additional electrical separation and lateral mechanical support for the distal ends 25 of the leads 22. The use of this channel and separator arrangement substantially simplifies lead formation since the leads 22 may be bent into their final position in one process step.

The second set of package leads 23 provides direct electrical connection with a circuit board or other external device, and accordingly may be bent into any desired configuration to accomplish this function. For example, selected ones of the leads 23 may be offset from the plane of the remainder of the leads, as illustrated by the silhouetted leads 23 in FIG. 3. These second leads 23 are shorter than the first leads 22 described above, but can be made to any length desired.

Note also that the connector housing 40 may also be provided with one or more mounting elements 55 as shown in FIG. 3 to facilitate mounting one or more connectors to the external device. Additionally, the finally assembled connector may be partially encapsulated in order to provide additional electrical isolation of the first leads 22.

The electrical component package 16 of the present embodiment is ideally a dual in-line (DIP) device of the type well known in the electronic arts, such as that manufactured by Pulse Engineering, Inc. and described in U.S. Pat. No. 5,015,981, incorporated by reference herein in its entirety. As described further below, this package design incorporates a so-called "interlock base" and a complementary conductive leadframe from which the first and second leads 22, 23 are formed. This arrangement provides, inter alia, an easy and repeatable way of establishing lead spacing and orientation with respect to the connector housing 40. While this DIP design potentially affords a number of different advantages, it can be appreciated that a wide variety of other component packages and mounting techniques may be used within the housing 40 with equal success. See for example, the epoxy encapsulation method disclosed in the copending U.S. patent application entitled "Modular Microelectronic Connector and Method", Ser. No. 09/295,286, filed Apr. 20, 1999 and assigned to Pulse Engineering Inc., which is also incorporated herein by reference in its entirety.

As shown in FIG. 3, the microelectronic package 16 used in the present embodiment of the connector is comprised of, inter alia, a non-conducting interlock base 18 having component recesses 19, one or more electrical components 20 (an inductive reactor or choke coil in this embodiment) with associated conductors, and component electrical leads 22, 23 formed from a common leadframe (not shown). An outer encapsulating package separate from the molded outer housing 40 may also be included if desired, although the molded connector housing may be used alone to encapsulate the package 16.

Figure 4:
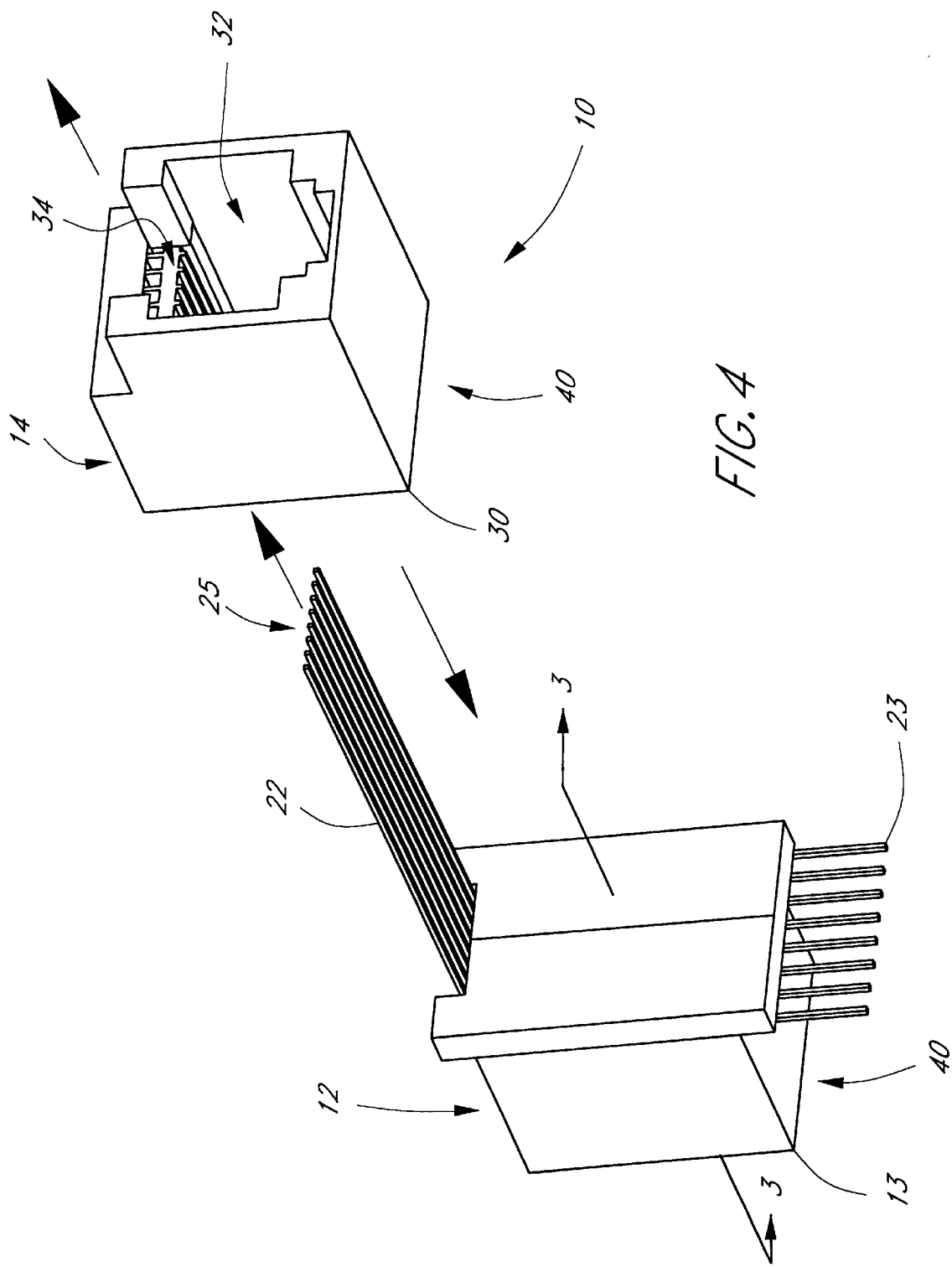
FIG. 4 is an exploded perspective view of a second embodiment of the connector of the invention, prior to assembly.

FIG. 4 illustrates a second embodiment of the microelectronic connector 10 of the present invention. In this embodiment, the connector 10 is composed of a housing 40 having two pieces, namely the component trailer 12 and the sleeve 14. The component trailer 12 is comprised of a standard microelectronic package (not shown) such as those previously described, encased within an outer housing 13 which is molded or formed from polymer, resin, or other suitable substantially non-conductive material Referring again to FIG. 4, the leads 22, 23 of the internal component package can be seen protruding from the housing 13 of the trailer 12. The first set of leads 22 is cut to a desired length such that the leads can ultimately be extended to form the electrical contacts within the modular plug receptacle cavity 32 of the sleeve 14. The leads 22 are bent or deformed in close proximity to the package (either before or after encapsulation of the package 16 within the housing 13 of the trailer 12) to permit mating of the carrier 12 with the front sleeve 14 as shown. The sleeve 14 is comprised of a resin, polymer, or similar outer housing 30 having an internal cavity 32 for receiving a modular plug, as well as a plurality of apertures 34 for receiving the electrical leads 22 of the trailer when the connector is assembled. Similar to the first embodiment described above, these leads 22 are subsequently bent down within the front sleeve cavity 32 to the desired angle so as to form the desired electrical contact with the contacts of the modular plug inserted into the cavity. Note that while the trailer 12 and sleeve 14 may be bonded together for increased mechanical rigidity using adhesive, mechanical locking tabs, friction fit, or any other suitable means, sufficient mechanical force is provided by the deformed leads 22 to maintain the trailer 12 and sleeve 14 in relative physical position when the connector is assembled without the use of such adhesives or other bonding means. This feature allows the connector to be manufactured more cheaply if desired. Additionally, ridges or other similar artifacts (such as pins and corresponding recesses) may be formed on the mating surfaces of the trailer and sleeve to further enhance the mechanical rigidity of the assembled connector.

Further shown in FIG. 4 are the second set of leads 23 which allow direct electrical and physical interconnection of the connector 10 to a circuit board or other component. These leads 23 are cut to desired length during the manufacturing process of the component package 16 to permit direct insertion of the leads 23 within the circuit board, and are analogous to those of the prior embodiment.

Figure 5:
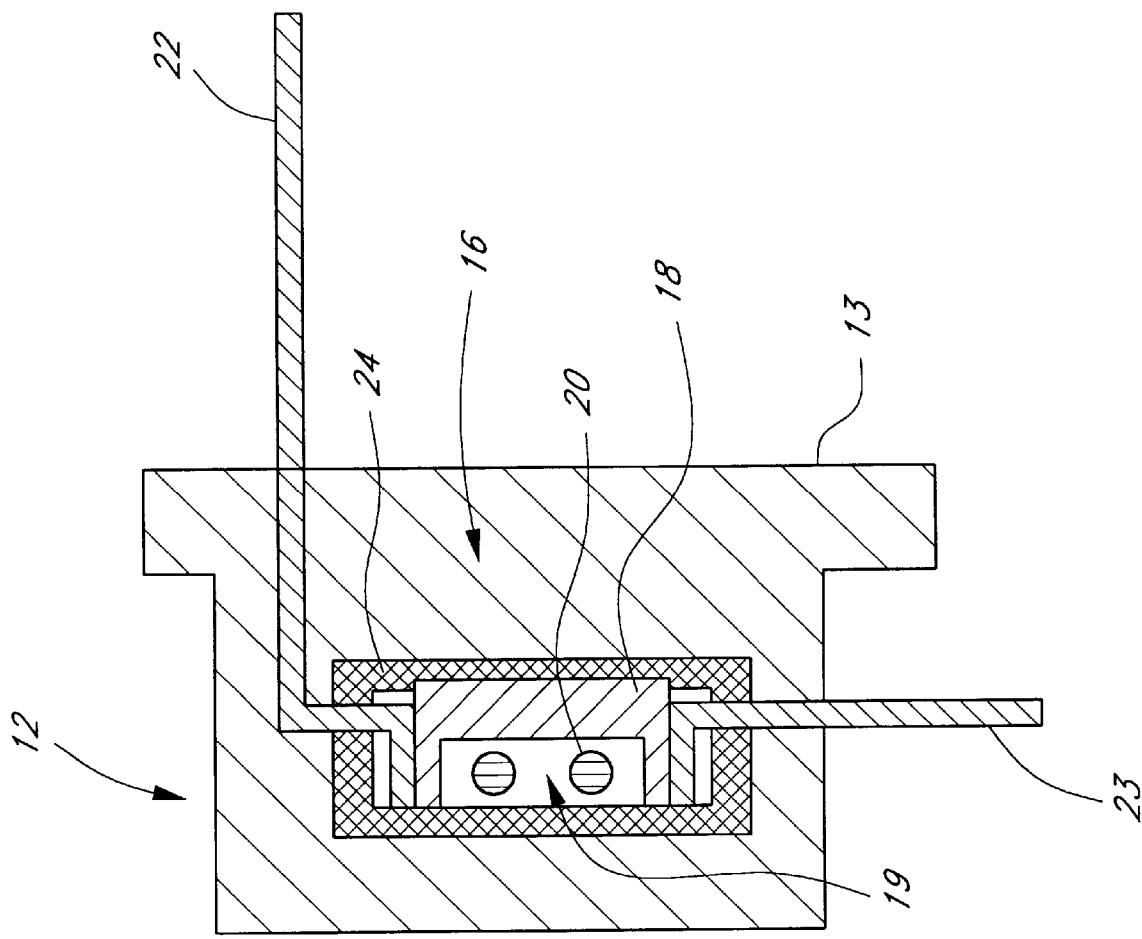
FIG. 5 is a cross-sectional view of the trailer used in the connector of FIG. 4 taken along line 5—5 of that Figure, showing the electrical component package and leads associated therewith.

FIG. 5 illustrates the internal components of the trailer 12 of the second embodiment of the present invention. As with the first embodiment, a microelectronic component package 16 having a nonconducting interlock base 18, electrical components 20, and electrical leads 22, 23 formed from a common leadframe is used. It will be recognized that other electrical component mounting and encapsulation arrangements may be used with this second embodiment as well.

Figure 6:
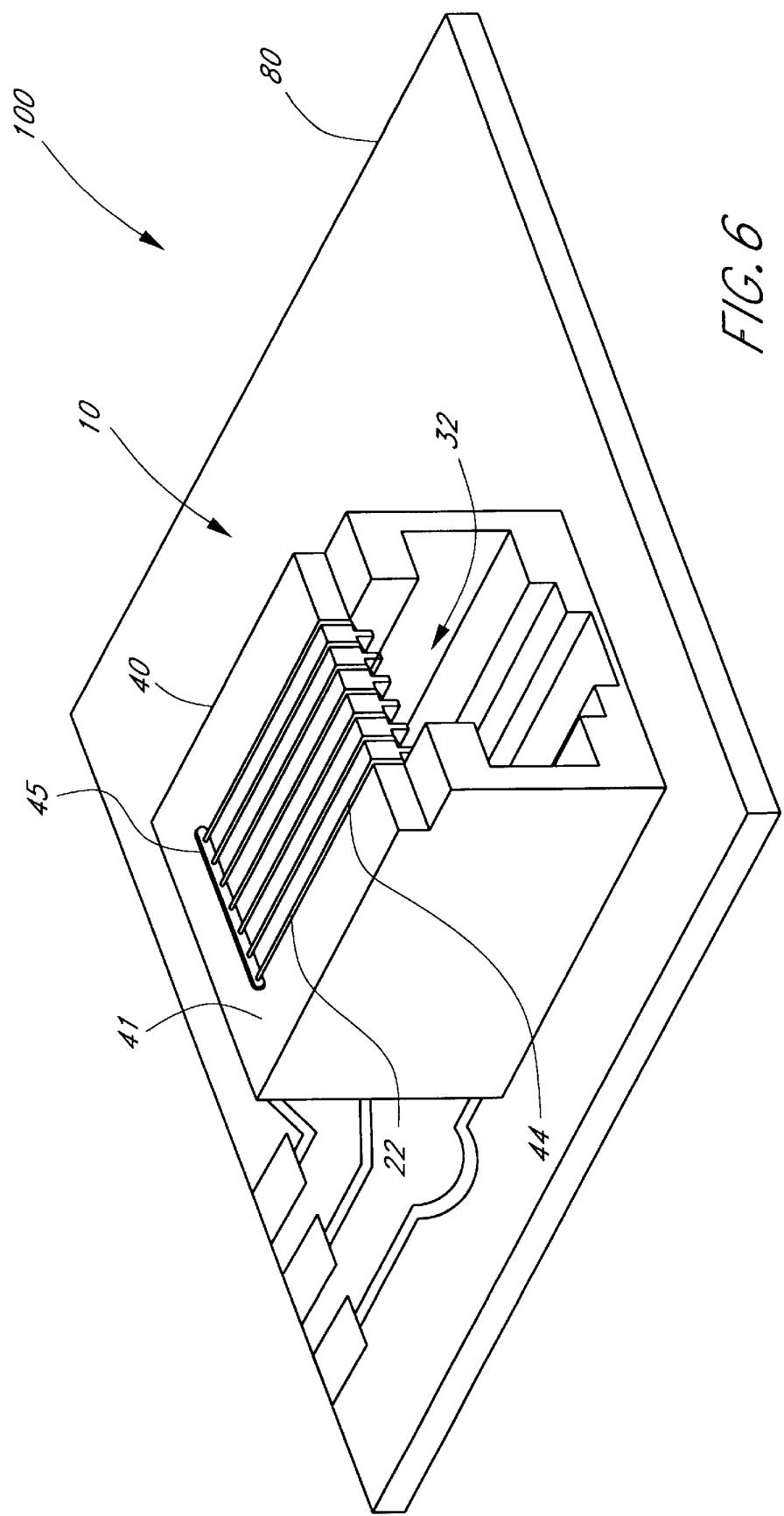
FIG. 6 is a perspective view of a circuit board assembly incorporating the connector FIG. 2.

Referring now to FIG. 6, one embodiment of a circuit board assembly 100 incorporating the microelectronic connector 10 of FIG. 2 above is illustrated. In this embodiment, the connector 10 is solder bonded to the contact elements (not shown) of a standard printed circuit board 80 of the type well known in the electrical arts, such that the modular plug cavity 32 is accessible. It will also be recognized that the two-piece connector of FIG. 4 may be substituted on the circuit board 80 in place of or in addition to the one-piece connector previously described.

METHOD OF MANUFACTURE

Referring now to FIGS. 7 through 10, improved methods of manufacturing the microelectronic connectors of the present invention are described.

Figure 7:
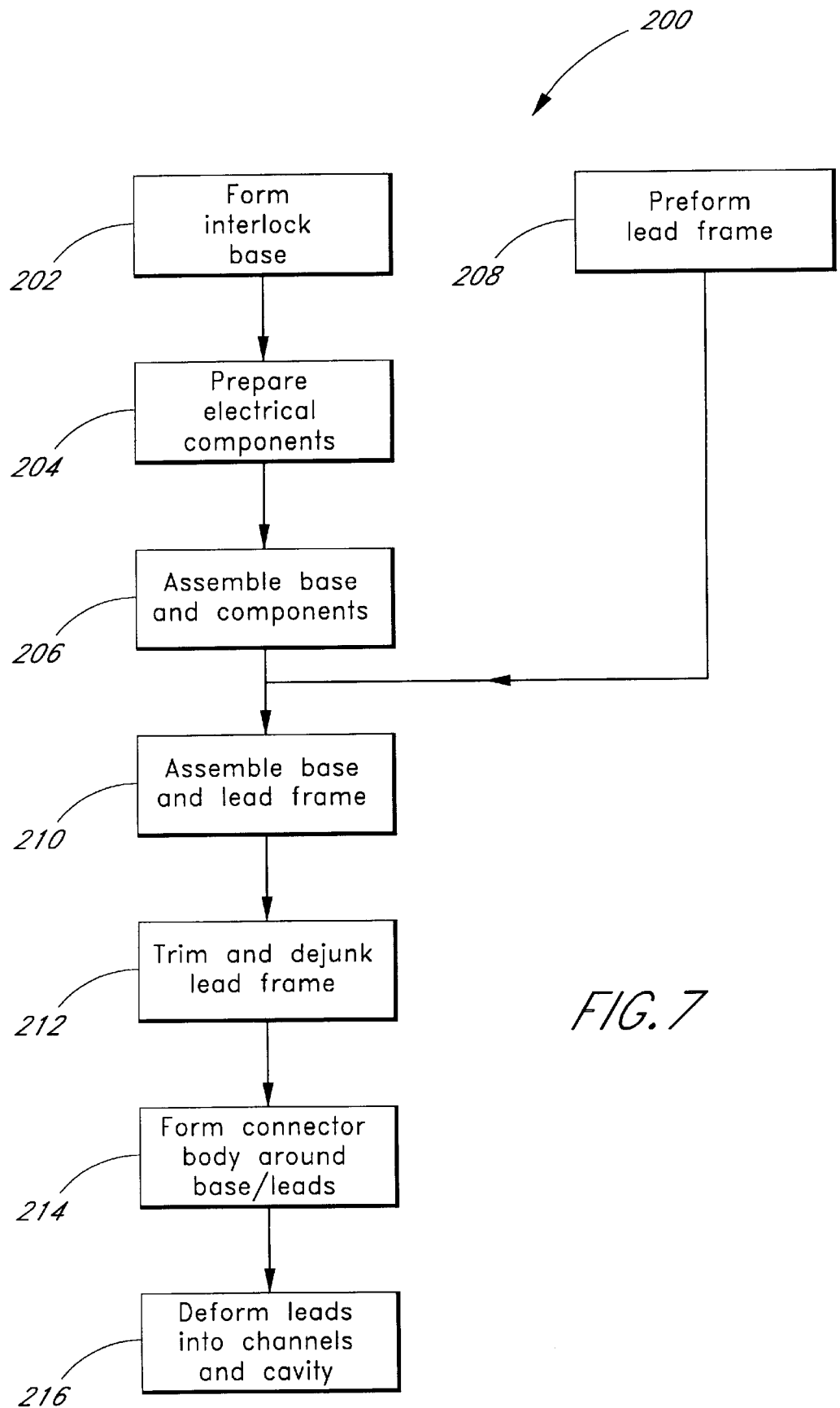
FIG. 7 is a process flow diagram illustrating one embodiment of a method of manufacturing the one-piece connector of FIG. 2.

FIG. 7 is a process flow diagram illustrating the general method of manufacturing the unitary or one-piece connector of FIG. 2 above. As illustrated in FIG. 7, the first step 202 of the manufacturing method 200 is the formation of the interlock base 18. The interlock base is ideally formed using an injection molding process (as described in the aforementioned U.S. Pat. No. 5,015,981). The interlock base includes one or more recesses 19 as depicted in FIG. 3 for receiving the electrical components, as well as channels (not shown) designed to receive the component conductors and connector leads 22, 23.

Next, the electrical components (such as choke coils or transformers) associated with the base are prepared in the second step 204. In the case of magnetic components, this preparation generally includes 1) the formation of the toroidal core, 2) winding the formed toroidal core with one or more conductors, and 3) coating of the wound core with a silicone gel or similar substance. Note that this second step 204 may be performed at any stage in the method prior to, or in parallel with, step 206 described below.

In the third process step 206, the aforementioned electrical components are installed in the recess(es) of the interlock base 18 and the conductors are routed within the channels of the base.

In a fourth process step 208, the electrically conductive leadframe is preformed so as to facilitate mating with the channels of the interlock base assembly. In a fifth step 210, the preformed leadframe and the interlock base (with installed electrical components) are mated and the leadframe bonded to the conductors of the electrical component(s) using any number of conventional techniques including soldering. This forms an electrical pathway between individual ones of the leads 22, 23 through the electrical component.

In the sixth process step 212, the leadframe is trimmed and dejunked so as to form the individual package leads 22, 23. The first leads 22 are trimmed to the desired length to permit deformation within the modular plug cavity 32, as described below. This completes fabrication of the interlock base assembly. Note, however, that the interlock base assembly may optionally be encapsulated prior to formation of the connector body 40 as described below.

In a seventh process step 214, the connector body 40 is formed around the completed interlock base assembly. An injection molding process is ideally used for economy and ease of production, although other molding and formation processes may be substituted. At the completion of the connector body formation process, the interlock base assembly is completely encased within the rear portion of the connector body, with the exception that the first and second leads protrude from the top and bottom exterior surfaces of the body 40, respectively.

In the eighth and final process step 216, the first leads 22 are deformed downward into the channels 44 formed in the top of the connector body 40 and subsequently into the modular plug cavity 32 in the front portion of the connector. When the deformation process is complete, the distal ends of the leads 22 reside generally between the separators 27 formed within the cavity so as to maintain physical alignment and electrical separation. Note also that the lead spacing may optionally be tapered, so as to reduce the spacing from 50 mils to 40 mils, as described above, during this final process step 216.

Figure 8A:
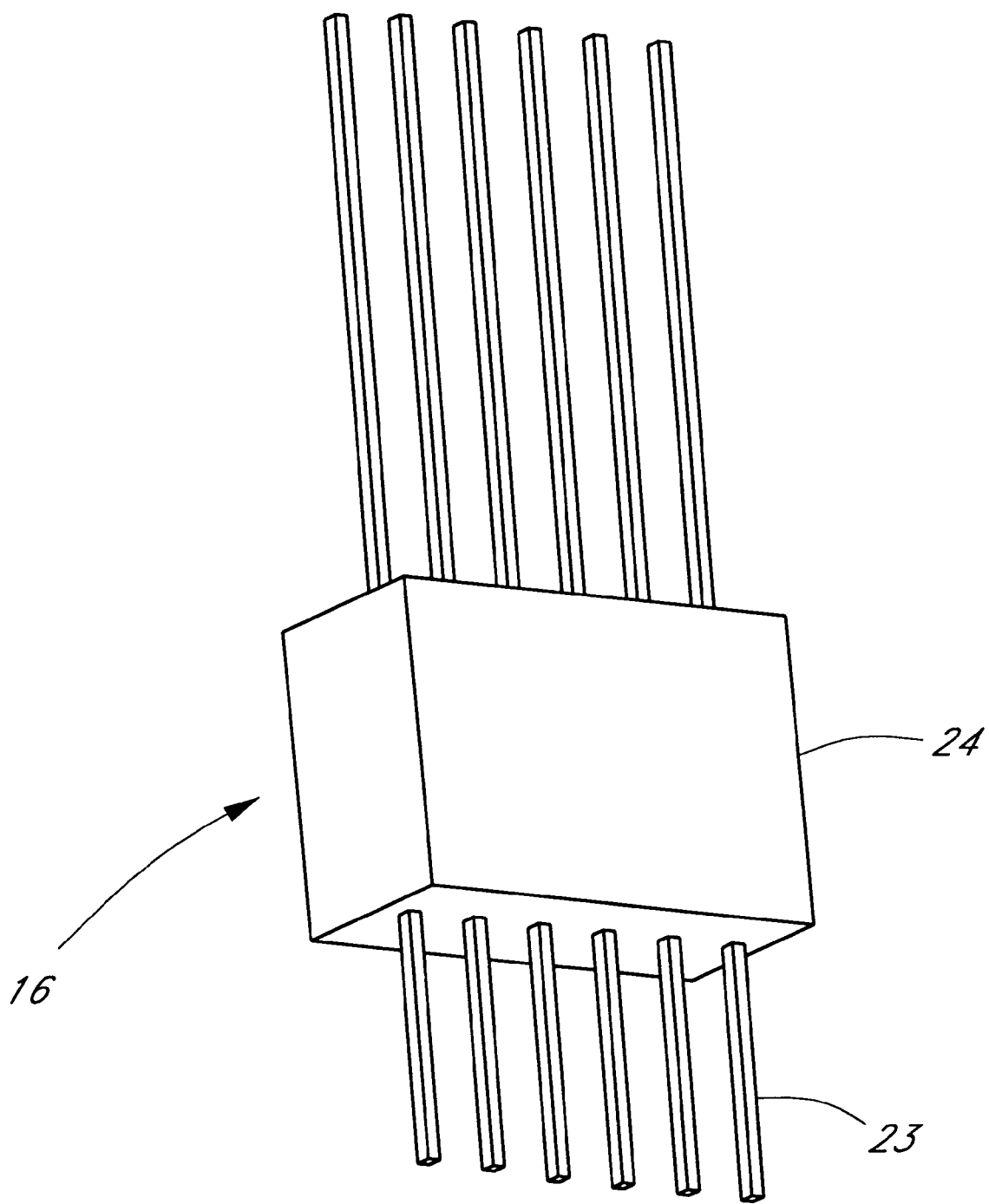
FIGS. 8a–8d are perspective views of the one-piece connector of FIG. 2 illustrating the configuration of the connector during various stages of the manufacturing process of FIG. 7.
Figure 8B:
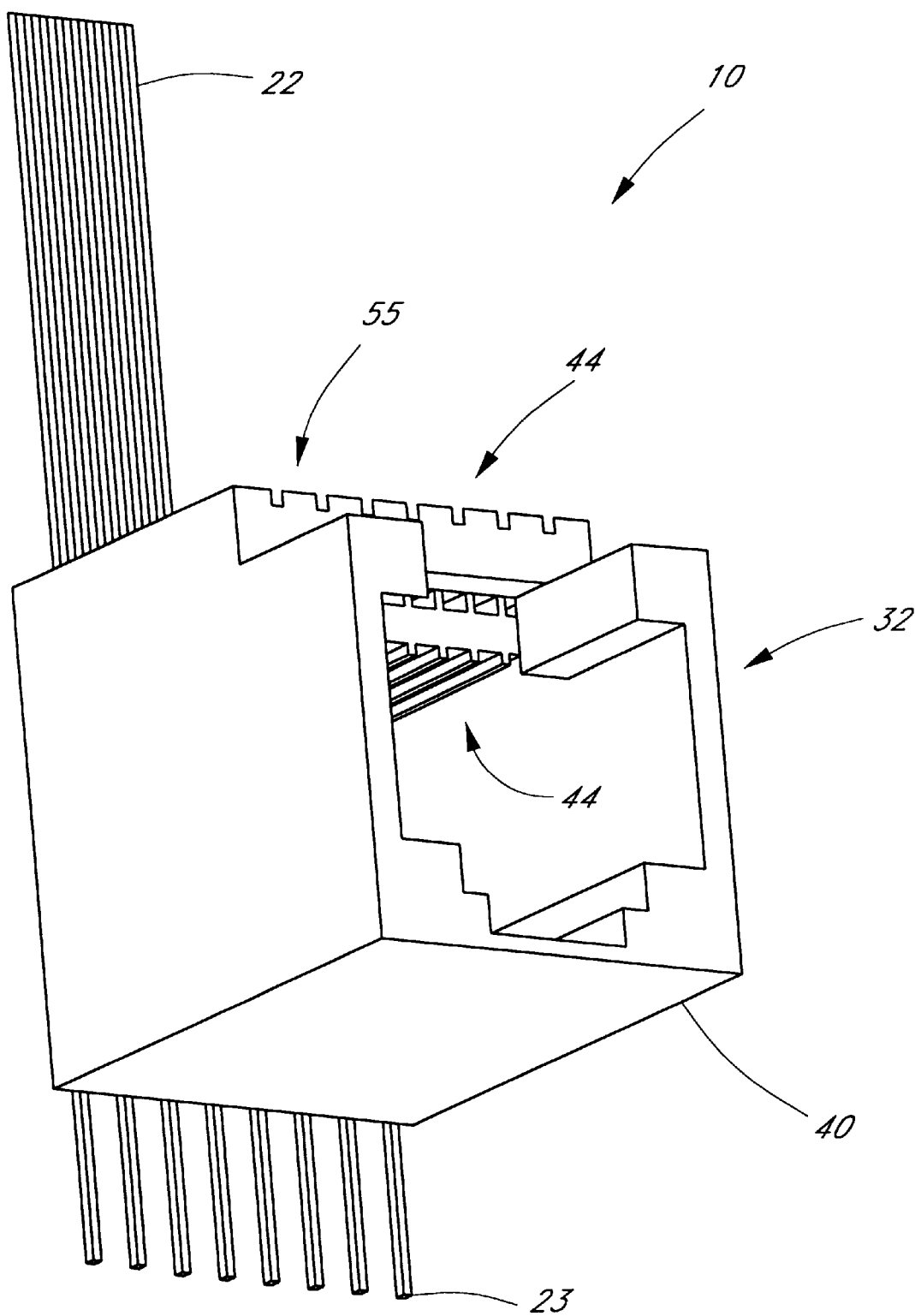
Figure 8C:
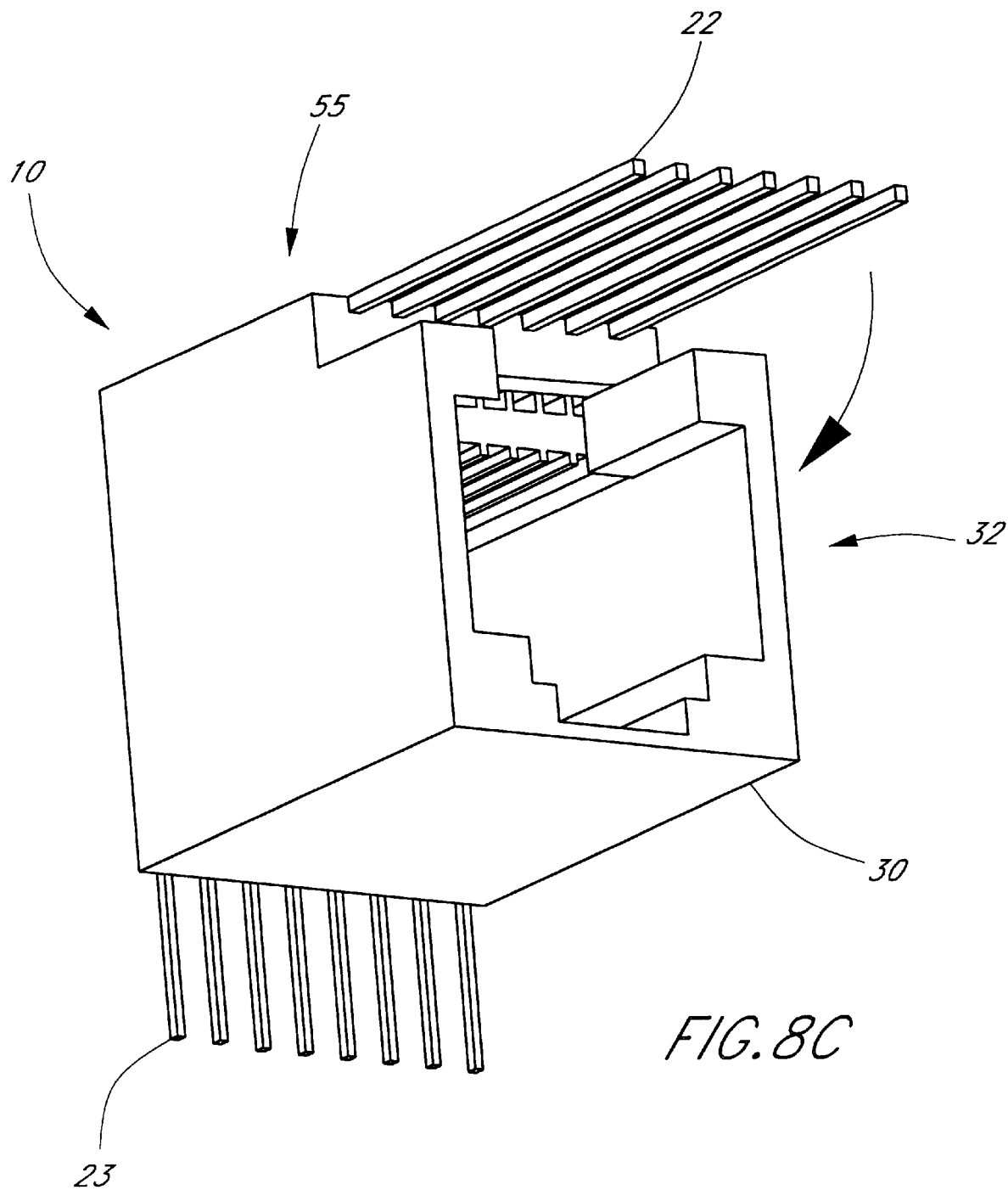
Figure 8D:
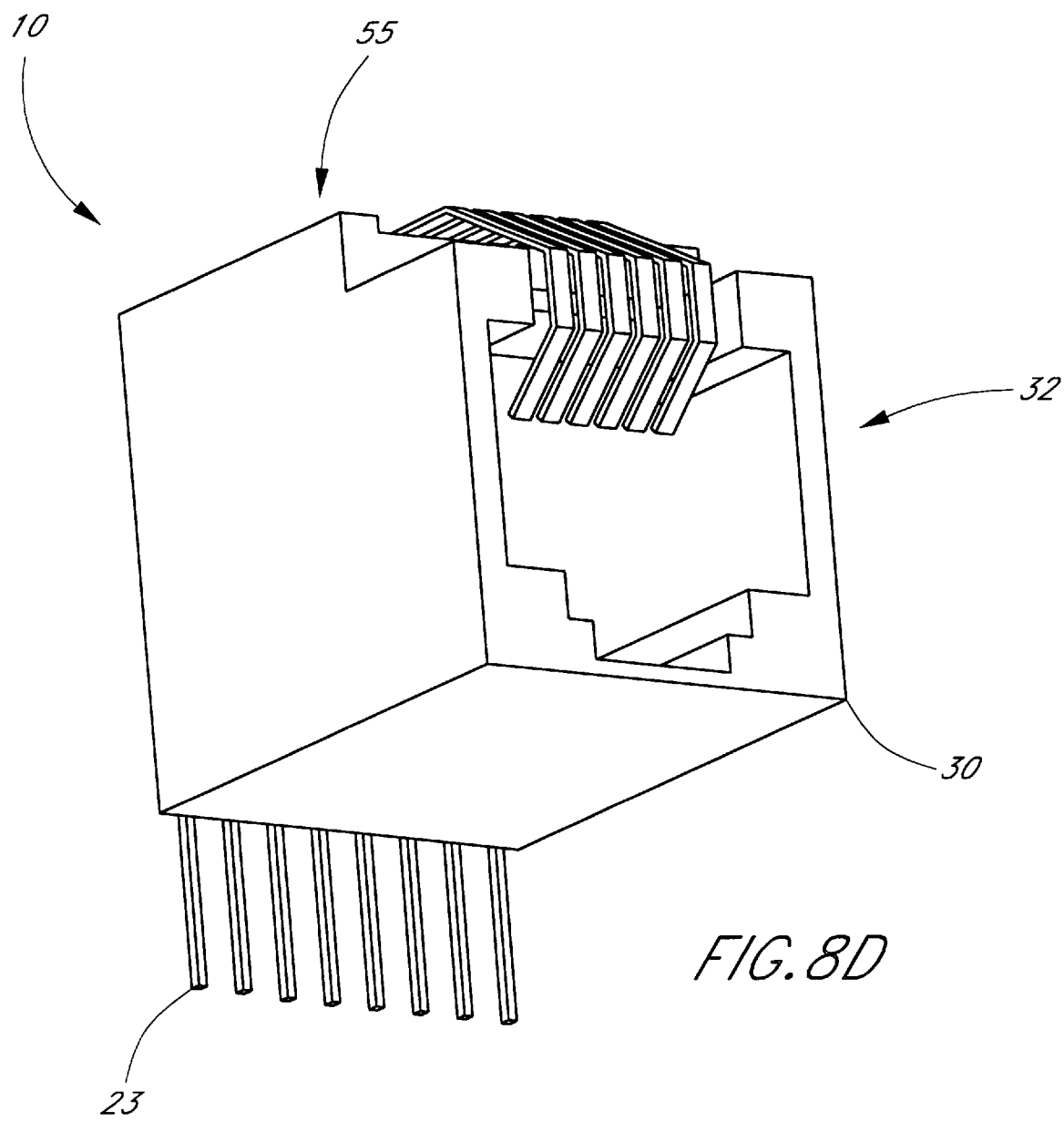

FIGS. 8a–8d show the connector of FIG. 2 during various stages of the manufacturing method 200 described above. FIG. 8a illustrates the finished component package (without encapsulation) at the completion of process step 212. The package is then encapsulated within the housing 40 per process step 214 to form the connector shown in FIG. 8b. The leads 22 are then deformed downward onto the top surface 55 of the connector and guide channels 44 contained thereon (FIG. 8c). Finally, the leads are deformed so as to extend into the cavity 32 and between the separators 27 within the cavity 32 as shown in FIG. 8d.

Figure 9:
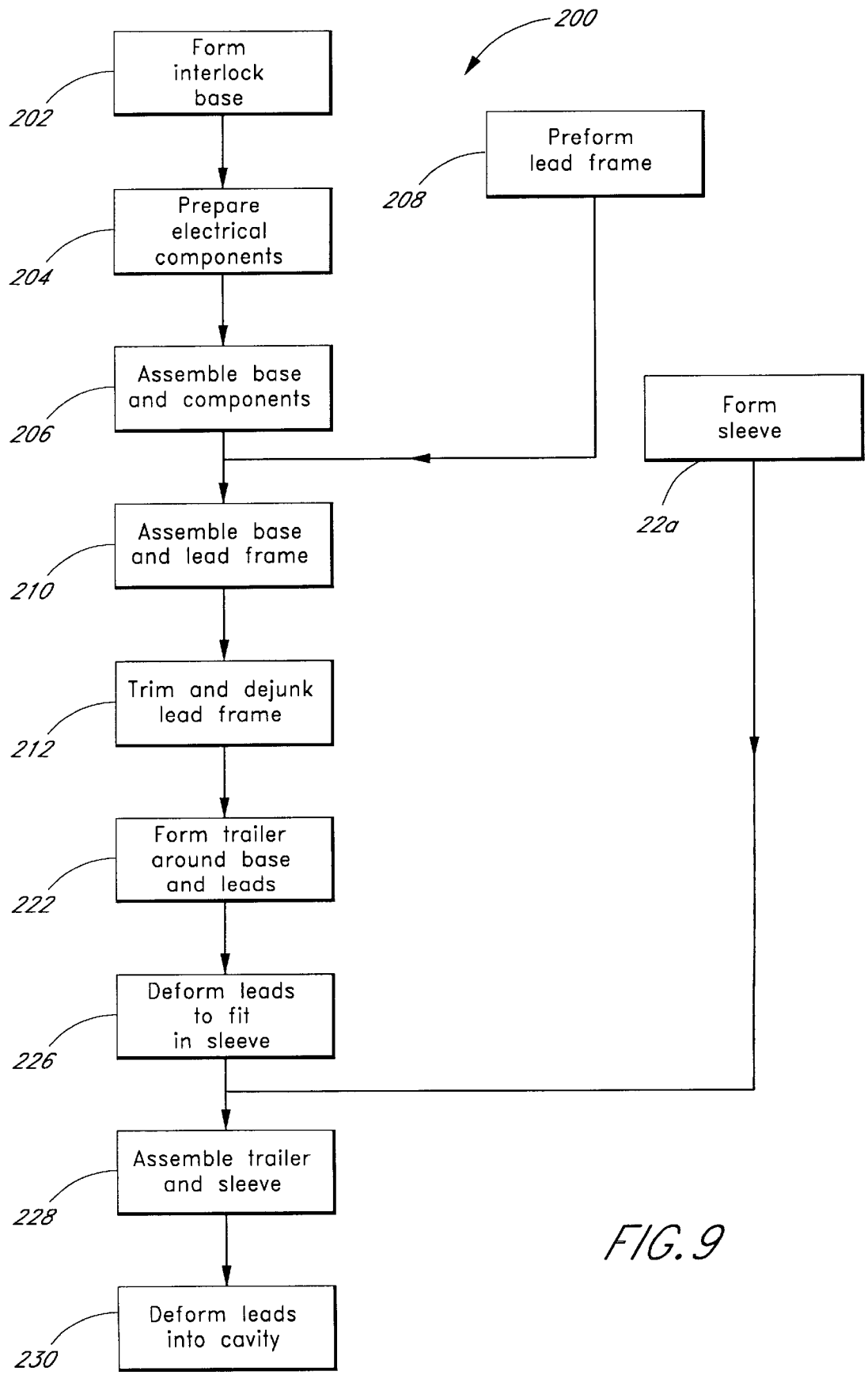
FIG. 9 is a process flow diagram illustrating one embodiment of a method of manufacturing the two-piece connector of FIG. 4.

Referring now to FIG. 9, a method of manufacturing the two-piece microelectronic connector of FIG. 4 is described. The initial six process steps 202, 204, 206, 208, 210 of this method 220 are functionally identical to those described above with reference to the method 200 of manufacturing the one-piece connector, and accordingly will not be described further. However, the seventh process step 222 of this method 220 involves the formation of the trailer assembly 12 which incorporates the completed interlock base assembly. The trailer is ideally formed using a transfer molding process, although other processes may be used. In parallel with the trailer formation of step 222, the sleeve 14 is formed using an injection molding or other comparable process (step 224). The first leads 22 of the trailer assembly 12 are next deformed in process step 226 toward the forward portion of the trailer, at an angle coincident with that of the apertures formed within the sleeve 14, such that the distal ends of the leads 22 are received by the apertures 34 of the sleeve 14 when the trailer 12 and sleeve 14 are mated.

Next, the trailer 12 with deformed leads 22 and sleeve 14 are mated in process step 228. An adhesive or other bonding means may be optionally applied to one or both of the components to enhance the rigidity of the assembled connector.

Lastly, in the final process step 230, the distal ends 25 of the first leads 22 extending from the apertures 34 of the sleeve 14 are bent down through the channel 51 in the front portion of the sleeve and between the separators 27 situated within the modular plug cavity 32. The force imparted on the front portion of the sleeve 14 by the deformed leads 22 assists in maintaining the sleeve in communication with the trailer 12.

Figure 10A:
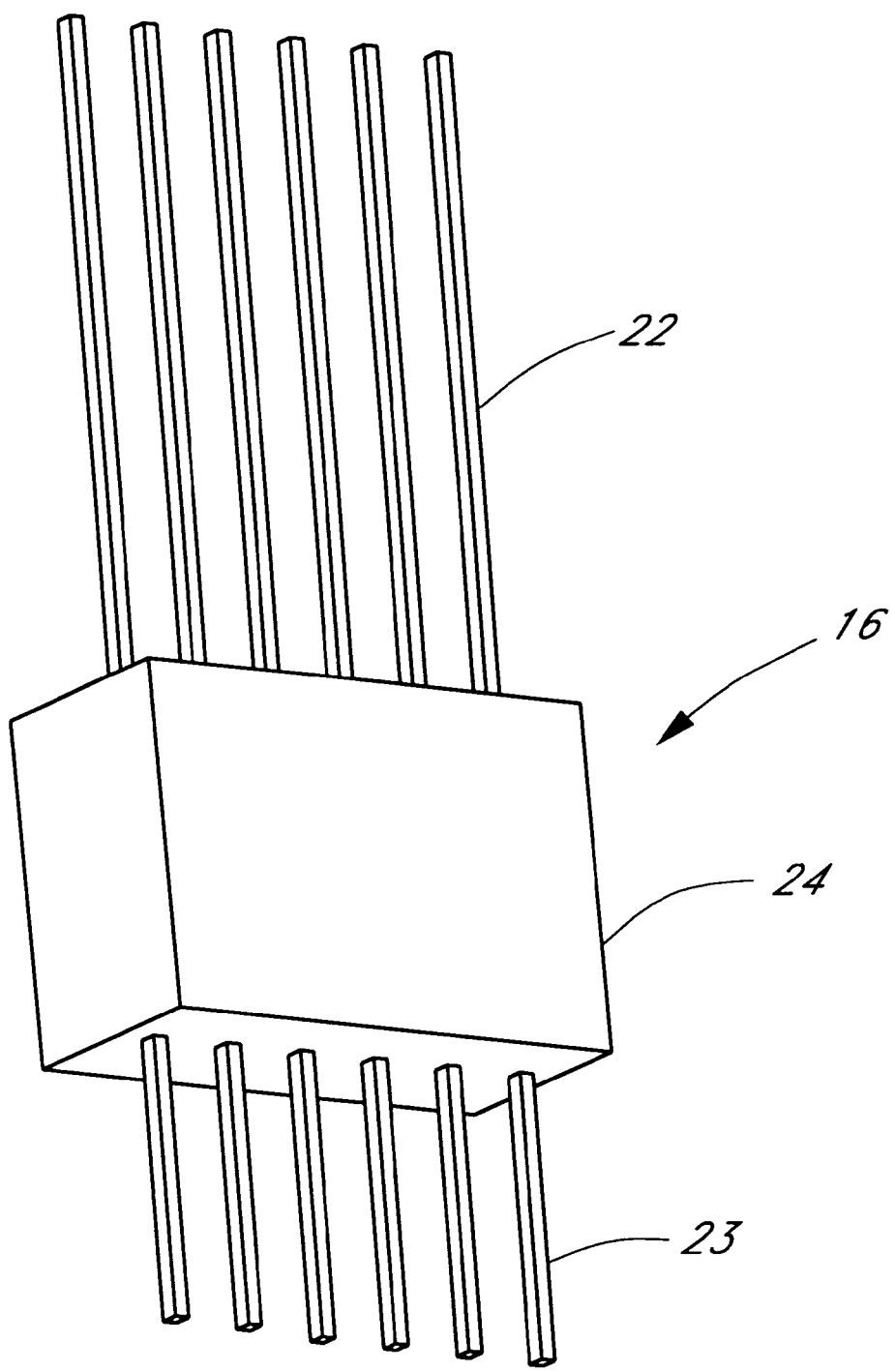
FIGS. 10a–10d are perspective views of the two-piece connector of FIG. 4 illustrating the configuration of the connector during various stages of the fabrication process of FIG. 9.
Figure 10B:
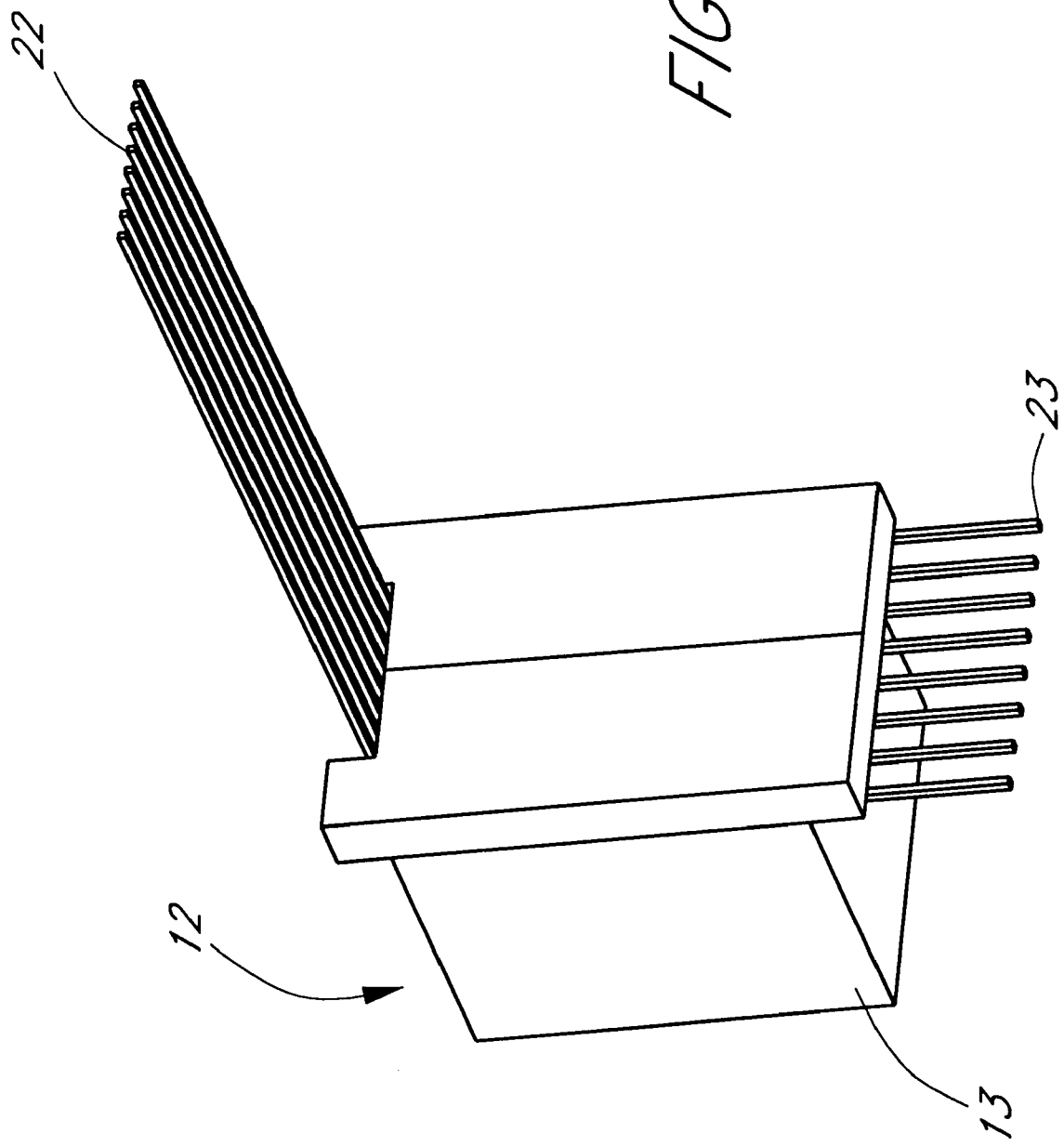
Figure 10C:
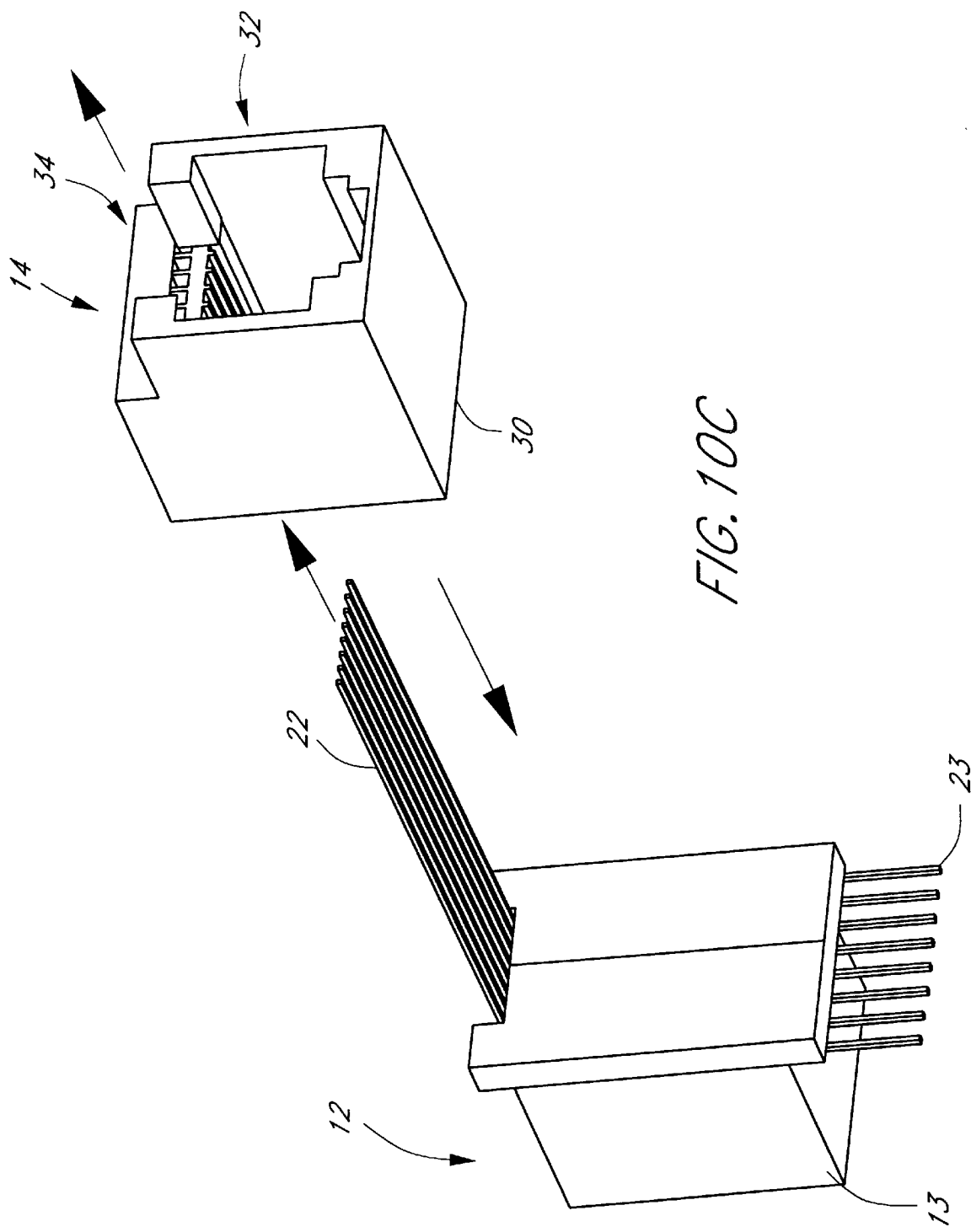
Figure 10D:
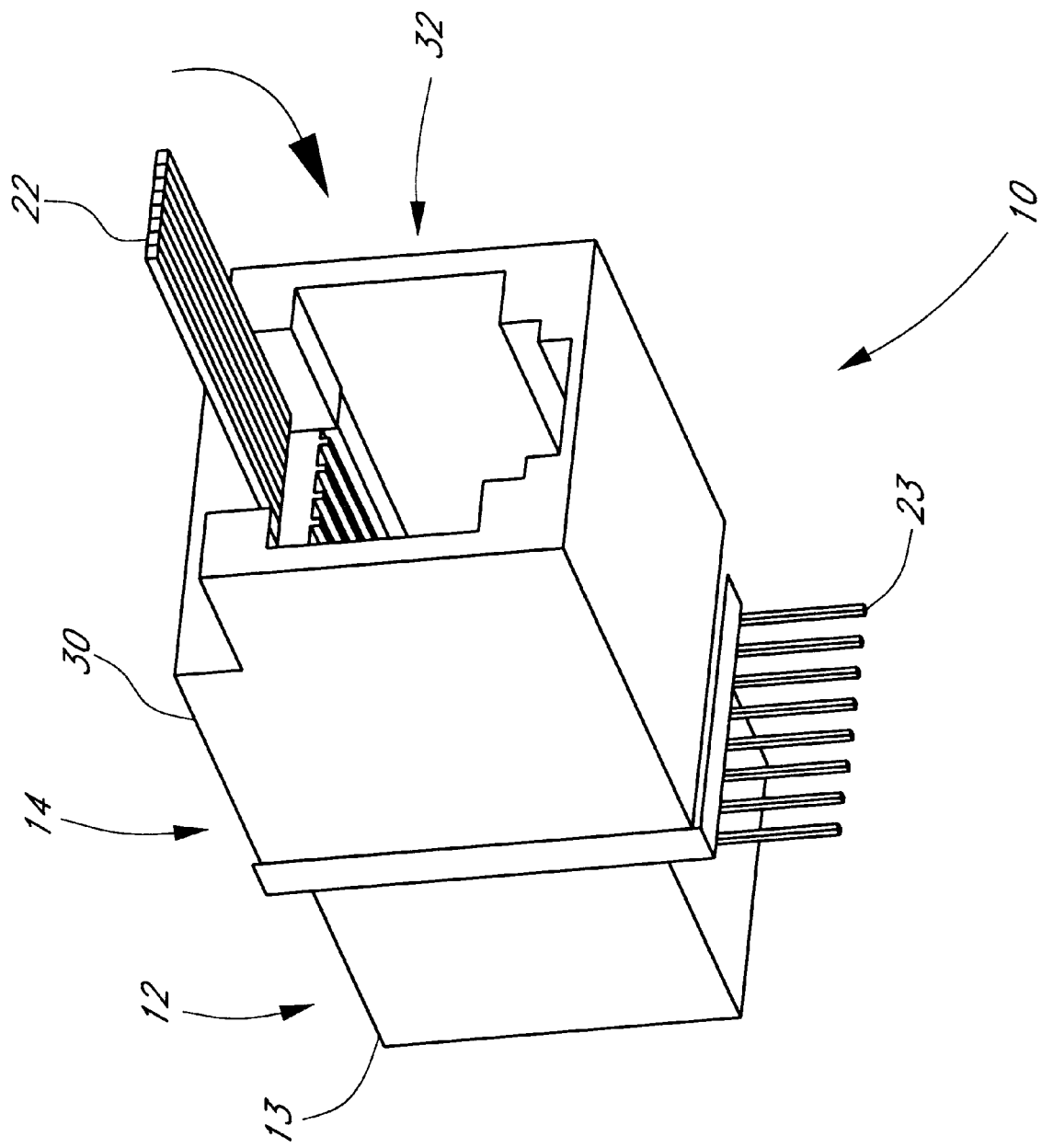

Referring now to FIGS. 10a–10d, the method 220 of fabricating the two-piece connector of FIG. 4 is illustrated. As shown in FIG. 10a, a component package 16 such as the interlock base assembly previously described is formed having first and second electrical leads 22, 23. The package is then encapsulated within a polymer housing 13 and leads bent over to form the trailer assembly 12 (FIG. 10b). The trailer 12 is then mated with and bonded to the sleeve 14 of the connector as shown in FIG. 10c, the first leads 22 of the carrier 12 being inserted through the apertures 34 in the sleeve 14. Finally, as shown in FIG. 10d, the first leads 22 are deformed downwardly and inward into the cavity 32 and between the separators 27 contained therein.

It should be re-emphasized that a significant advantage of using the connector configurations shown in FIGS. 2 and 4 is the reduction of process steps and materials necessary to fabricate the connector. Not only is an existing product (component package 16) used in order to minimize the need for any additional manufacturing equipment or retooling, but a simplified connector body construction also permits the connector to be assembled with a minimum amount of effort without using any circuit boards, lead carriers, or multi-part embedded electrical leads.

It will be recognized that while the methods set forth above are described in terms of a specific sequence, certain steps of this sequence may be eliminated, or the order of steps permuted, without departing from the spirit of the invention. For example, the formation of the interlock base 18 (step 202 of FIG. 7) may be performed before, after, or in parallel with step 204 (preparation of the electrical components) as desired. Similarly, the deformation of the leads 22 described in step 230 of FIG. 9 may be performed prior to molding of the trailer in step 222. Many different combinations of steps of the generalized processes described herein are possible.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention.

What is claimed is:

1. A connector, comprising:
   a connector housing having an exterior surface, said exterior surface having an edge, a plurality of channels disposed substantially on said exterior surface, and a cavity formed within said housing, said cavity adapted to receive a modular plug having electrical contacts; and
   at least one electrical component disposed at least partially within said housing, said at least one electrical component having a plurality of electrical leads projecting therefrom, said electrical leads being disposed within respective ones of said channels and being bent around said edge of said exterior surface into said cavity, said electrical leads adapted to form an electrical conduction path between said at least one electrical component and said electrical contacts of said modular plug.

2. The connector of claim 1, wherein said modular plug is an RJ type plug.

3. The connector of claim 1, wherein said at least one electrical component is a magnetic component.

4. The connector of claim 3, wherein said magnetic component is a choke coil disposed within an interlock base assembly.

5. The connector of claim 1, wherein said connector housing is formed via a molding process.

6. The connector of claim 1, wherein said connector further comprises a plurality of electrical leads forming an electrical pathway between said at least one electrical component and an external device.

7. The connector of claim 6, wherein said connector housing has a top surface and said exterior surface is the top surface of the connector housing.

8. The connector of claim 7, wherein said channels are substantially parallel to one another.

9. A connector, comprising:

a connector housing having an exterior surface, a plurality of channels disposed substantially on said exterior surface, and a cavity formed within said housing, said cavity adapted to receive a modular plug having electrical contacts; and at least one electrical component disposed at least partially within the interior of said housing, said at least one electrical component having a plurality of electrical leads projecting therefrom, said electrical leads being disposed within respective ones of said channels and forming an electrical conduction path between said at least one electrical component and said electrical contacts of said modular plug;

wherein said connector further comprises a second set of electrical leads forming an electrical pathway between said at least one electrical component and an external device;

wherein said exterior surface is the top surface of the connector housing;

wherein said channels are substantially parallel to one another; and wherein at least a portion of said connector is encapsulated within an insulating coating.

10. A microelectronic connector, comprising:

a connector housing having;

an exterior surface, said exterior surface having an edge;

a plurality of channels disposed substantially on said exterior surface;

a first cavity formed within said housing, said first cavity adapted to receive a modular plug having electrical contacts; and a second cavity also formed within said housing;

at least one electrical component disposed at least partially within said second cavity, said at least one electrical component having a plurality of first electrical leads projecting therefrom, said electrical leads being disposed within respective ones of said channels and being bent around said edge of said exterior surface into said first cavity, said electrical leads forming an electrical pathway between said at least one electrical component and said electrical contacts of said modular plug; and a plurality of second electrical leads, said plurality of second electrical leads forming an electrical pathway between said at least one electrical component and an external device.

11. A microelectronic connector, comprising:

a connector housing having a first and second cavities and a plurality of apertures connecting said first and second cavities, said first cavity adapted to receive at least a portion of a modular plug having electrical contacts;

an electrical component assembly disposed within said second cavity, said component assembly having a plurality of electrical leads projecting therefrom;

wherein said electrical leads are further disposed at least partly within said apertures and are deformed within said second cavity to form a plurality of electrical contacts which mate with said contacts of said modular plug when said plug is inserted into said first cavity.

12. The connector of claim 11, wherein said electrical component assembly comprises a magnetic component.

13. The connector of claim 12, wherein said electrical component assembly is an interlock base assembly.

* * * * *